(12) United States Patent
Avrutsky

(10) Patent No.: US 8,982,591 B2
(45) Date of Patent: Mar. 17, 2015

(54) SYSTEM AND METHOD FOR EXCHANGEABLE CAPACITOR MODULES FOR HIGH POWER INVERTERS AND CONVERTERS

(75) Inventor: Mordechay Avrutsky, Alfei Menashe (IL)

(73) Assignee: Tigo Energy, Inc., Los Gatos, CA (US)

( * ) Notice: Subject to any disclaimer, the term of this patent is extended or adjusted under 35 U.S.C. 154(b) by 232 days.

(21) Appl. No.: 13/410,175

(22) Filed: Mar. 1, 2012

(65) Prior Publication Data

US 2013/0094262 A1 Apr. 18, 2013

Related U.S. Application Data

(60) Provisional application No. 61/548,674, filed on Oct. 18, 2011.

(51) Int. Cl.
H02M 3/335 (2006.01)
H02M 1/32 (2007.01)
(Continued)

(52) U.S. Cl.
CPC .............. H02M 1/32 (2013.01); G01R 31/028 (2013.01); H02M 7/04 (2013.01); H02M 7/4807 (2013.01); G01R 31/42 (2013.01)
USPC ........................................................ 363/95

(58) Field of Classification Search
CPC ... H02M 3/335; H02M 3/33507; H02M 7/04; H02M 7/48; G01R 31/028; G01R 31/42; H02J 3/382
USPC ........... 363/35, 37, 95, 97, 98, 123–125, 131, 363/132
See application file for complete search history.

(56) References Cited

U.S. PATENT DOCUMENTS 4,384,321 A * 5/1983 Rippel ........................ 363/124
5,155,670 A 10/1992 Brian
(Continued)

FOREIGN PATENT DOCUMENTS

AU 2005262278 7/2005
DE 4232356 3/1994
(Continued)

OTHER PUBLICATIONS

Alonso, R. et al., "A New Distributed Converter Interface for PV Panels," 20th European Photovoltaic Solar Energy Conference, Barcelona, Spain, pp. 2288-2291, Jun. 6-10, 2005.
(Continued)

*Primary Examiner* — Adolf Berhane
*Assistant Examiner* — Yemane Mehari
(74) *Attorney, Agent, or Firm* — Greenberg Traurig LLP

(57) ABSTRACT

A method of and system for monitoring condition of a large capacitor connected across an output of a rectifier circuit in an operating electrical power transmission circuit in order to anticipate capacitor failure and facilitate appropriate corrective action is disclosed. The method includes measuring a ripple voltage on the capacitor and ripple current through the capacitor, determining from a representative signal whether the signal exceeds a predetermined threshold; and sending an output to a controller on a system operator if the signal exceeds the predetermined threshold. The ripple current and ripple voltage measurements may be provided as inputs to a digital to analog converter which produces and sends the representative signal to a microprocessor to generate the output to the controller.

18 Claims, 8 Drawing Sheets

(51) Int. Cl.
*G01R 31/02* (2006.01)
*H02M 7/04* (2006.01)
*H02M 7/48* (2006.01)
*G01R 31/42* (2006.01)

(56) References Cited

U.S. PATENT DOCUMENTS

| | | |
|---|---|---|
| 5,235,266 A | 8/1993 | Schaffrin |
| 5,268,832 A | 12/1993 | Kandatsu |
| 5,604,430 A | 2/1997 | Decker et al. |
| 5,923,158 A | 7/1999 | Kurokami et al. |
| 6,275,016 B1 | 8/2001 | Ivanov |
| 6,448,489 B2 | 9/2002 | Kimura et al. |
| 6,650,031 B1 | 11/2003 | Goldack |
| 6,844,739 B2 | 1/2005 | Kasai et al. |
| 6,894,911 B2 | 5/2005 | Telefus et al. |
| 6,984,970 B2 | 1/2006 | Capel |
| 7,061,214 B2 | 6/2006 | Mayega |
| 7,248,946 B2 | 7/2007 | Bashaw et al. |
| 7,256,566 B2 | 8/2007 | Bhavaraju et al. |
| 7,276,886 B2 | 10/2007 | Kinder |
| 7,505,833 B2 | 3/2009 | Delmerico et al. |
| 7,518,346 B2 | 4/2009 | Prexl |
| 7,595,616 B2 | 9/2009 | Prexl |
| 7,605,498 B2 | 10/2009 | Ledenev et al. |
| 7,609,049 B1 * | 10/2009 | Tian et al. .................. 324/76.11 |
| 7,719,140 B2 | 5/2010 | Ledenev et al. |
| 7,808,126 B2 | 10/2010 | Stiesdal |
| 8,090,548 B2 | 1/2012 | Abdennadher et al. |
| 8,212,408 B2 | 7/2012 | Fishman |
| 8,853,886 B2 | 10/2014 | Avrutsky et al. |
| 2002/0109585 A1 | 8/2002 | Sanderson |
| 2003/0085621 A1 | 5/2003 | Potega |
| 2005/0057214 A1 | 3/2005 | Matan |
| 2005/0057215 A1 | 3/2005 | Matan |
| 2006/0001406 A1 | 1/2006 | Matan |
| 2006/0174939 A1 | 8/2006 | Matan |
| 2006/0185727 A1 | 8/2006 | Matan |
| 2007/0059986 A1 | 3/2007 | Rockwell |
| 2007/0228838 A1 | 10/2007 | Delmerico et al. |
| 2007/0273351 A1 | 11/2007 | Matan |
| 2008/0106241 A1 | 5/2008 | Deaver et al. |
| 2008/0121272 A1 | 5/2008 | Besser et al. |
| 2008/0122449 A1 | 5/2008 | Besser et al. |
| 2008/0122518 A1 | 5/2008 | Besser et al. |
| 2008/0172312 A1 | 7/2008 | Synesiou et al. |
| 2008/0179949 A1 | 7/2008 | Besser et al. |
| 2008/0191560 A1 | 8/2008 | Besser et al. |
| 2008/0191675 A1 | 8/2008 | Besser et al. |
| 2008/0224629 A1 | 9/2008 | Melanson |
| 2008/0303503 A1 | 12/2008 | Wolfs |
| 2009/0096211 A1 | 4/2009 | Stiesdal |
| 2009/0112493 A1 * | 4/2009 | Abdennadher et al. ......... 702/58 |
| 2009/0128102 A1 | 5/2009 | Thorvaldsson |
| 2009/0189456 A1 | 7/2009 | Skutt |
| 2009/0283129 A1 | 11/2009 | Foss |
| 2010/0327657 A1 | 12/2010 | Kuran |
| 2010/0332047 A1 | 12/2010 | Arditi |
| 2011/0304204 A1 | 12/2011 | Avrutsky et al. |
| 2011/0304213 A1 | 12/2011 | Avrutsky et al. |
| 2011/0304215 A1 | 12/2011 | Avrutsky et al. |

FOREIGN PATENT DOCUMENTS

| | | |
|---|---|---|
| DE | 19961705 | 7/2001 |
| EP | 169673 | 1/1986 |
| EP | 1388774 | 2/2004 |
| ES | 2249147 | 3/2006 |
| WO | 03012569 | 2/2003 |

OTHER PUBLICATIONS

Alonso, R. et al., "Experimental Results of Intelligent PV Module for Grid-Connected PV Systems," 21st European Photovoltaic Solar Energy Conference, Dresden, Germany, pp. 2297-2300, Sep. 4-8, 2006.

Basso, Tim, "IEEE Standard for Interrconnecting Distributed Resources With the Electric Power System," IEEE PES Meeting, Jun. 9, 2004.

Boostbuck.com, "The Four Boostbuck Topologies," located at http://www.boostbuck.com/TheFourTopologies.html, 2003.

Enslin, Johan H.R., et al., "Integrated Photovoltaic Maximum Power Point Tracking Converter," IEEE Transactions on Industrial Electronices, vol. 44, No. 6, pp. 769-773, Dec. 1997.

Gautam, Nalin K. et al., "An Efficient Algorithm to Simulate the Electrical Performance of Solar Photovoltaic Arrays," Energy, vol. 27, No. 4, pp. 347-361, 2002.

International Patent Application No. PCT/US2010/029929, International Search Report and Written Opinion, Oct. 27, 2010.

Linares, Leonor et al., "Improved Energy Capture in Series String Photovoltaics via Smart Distributed Power Electronics," 24th Annual IEEE Applied Power Electronics Conference and Exposition, pp. 904-910, Feb. 15, 2009.

Nordmann, T. et al., "Performance of PV Systems Under Real Conditions," European Workshop on Life Cycle Analysis and Recycling of Solar Modules, The "Waste" Challenge, Brussels, Belgium, Mar. 18-19, 2004.

Palma, L. et al., "A Modular Fuel Cell, Modular DC-DC Converter Concept for High Performance and Enhanced Reliability," 38th IEEE Power Electronics Specialists Conference (PESC'07), pp. 2633-2638, Jun. 17, 2007.

Quaschning, V. et al., "Cost Effectiveness of Shadow Tolerant Photovoltaic Systems," Eurosun 96, pp. 819-824, Sep. 16, 1996.

Roman, Eduardo, et al., "Intelligent PV Module for Grid-Connectred PV Systems," IEEE Transactions on Industrial Electronics, vol. 53, No. 4, pp. 1066-1073, Aug. 2006.

Uriarte, S. et al., "Energy Integrated Management System for PV Applications," 20th European Photovoltaic Solar Energy Conference, Jun. 6, 2005.

Walker, G. R. et al., "Cascaded DC-DC Converter Connection of Photovoltaic Modules," 33rd IEEE Power Electronics Specialists Conference (PESC'02), vol. 1, pp. 24-29, 2002.

Walker, Geoffrey R. et al., "Cascaded DC-DC Converter Connection of Photovoltaic Modules," IEEE Transactions on Power Electronics, vol. 19, No. 4, pp. 1130-1139, Jul. 2004.

U.S. Appl. No. 12/562,491, filed Sep. 18, 2009, entitled "Systems and Methods for Distributed Power Factor Correction and Phase Balancing."

U.S. Appl. No. 13/149,163, filed May 31, 2011, entitled "Systems for Use of Static Inverters in Variable Energy Generation Environments."

U.S. Appl. No. 13/149,172, filed May 31, 2011, entitled "Method for Use of Static Inverters in Variable Energy Generation Environments."

U.S. Appl. No. 13/157,016, filed Jun. 9, 2011, entitled "Systems and Methods to Optimize Outputs of Static Inverters in Variable Energy Generation Environments".

* cited by examiner

SYSTEM AND METHOD FOR EXCHANGEABLE CAPACITOR MODULES FOR HIGH POWER INVERTERS AND CONVERTERS

CROSS REFERENCE TO RELATED APPLICATIONS

This application claims the benefit of priority of U.S. Provisional Patent Application Ser. No. 61/548,674, filed Oct. 18, 2011, which is incorporated herein by reference in its entirety.

FIELD OF THE TECHNOLOGY

This disclosure relates generally to high power electrical transmission systems and more particularly to high power inverters and converters employing electrolytic capacitors.

BACKGROUND

Many converters are often out in the field, exposed to the elements, and at times in a very hot or very cold environment. Because they contain electrolytic capacitors, in particular, large electrolytic capacitors to support some internal high-voltage dc bus, they often end up not lasting very long because the capacitors die prematurely even if the remainder of the circuitry is good. In some cases, the capacitor may not completely die, but it may degrade to a point where its performance is reduced dramatically, so that eventually it shuts off for safety reasons.

The same problem occurs in the power supplies of computers and other electronic equipment, wherein the capacitors eventually die out. What is needed is a system and method for monitoring capacitor health in such electronic equipment and for making capacitors easily exchangeable.

SUMMARY OF THE DISCLOSURE

A method of monitoring condition of a capacitor connected across an output of a rectifier circuit in an operating electrical power transmission circuit in accordance with the present disclosure includes operations of measuring a ripple voltage on the capacitor; measuring a ripple current through the capacitor; determining a representative signal from the ripple voltage and current measurements; determining whether the signal exceeds a predetermined threshold; and sending an output to a controller on a system operator if the signal exceeds the predetermined threshold. This then can facilitate notification that the capacitor being monitored should be replaced soon. In particular, the ripple current and ripple voltage measurements may be provided as inputs to a digital to analog converter. This converter then produces and sends the representative signal to a microprocessor to generate the output to the controller. The measuring of ripple current may be performed by a rectifier and amplifier module to produce the direct current representative signal. The measuring of ripple voltage may be performed by a voltage divider module. A temperature of the capacitor may also be utilized, sending a temperature signal to the digital to analog converter.

A power inverter in accordance with the present disclosure may include a box housing such as a conventional enclosure having an electrical circuit therein including a dc to ac converter; and at least one electrolytic capacitor mounted to an exterior of the box. The capacitor is removably connected with the electrical circuit within the box. Preferably, the capacitor or capacitor bank may include a cutout switch for selectively removing the capacitor from electrical connection to the circuitry within the box. Such a power inverter preferably includes a capacitor health monitoring circuit operably connected to the capacitor. This monitoring circuit may be located within the box or on the capacitor enclosure.

The monitoring circuit may include a microprocessor programmed to perform operations of: measuring a ripple voltage on the capacitor; measuring a ripple current through the capacitor; determining a representative signal from the ripple voltage and current measurements; determining whether the signal exceeds a predetermined threshold; and sending an output to a controller if the signal exceeds the predetermined threshold. Such an output could be used to schedule maintenance on the capacitor.

Preferably the monitoring circuit senses voltage ripple across the capacitor and also senses ripple current through the capacitor. The ripple current and ripple voltage may be analyzed in a microprocessor programmed to compare a signal representative of the ripple current and ripple voltage to a predetermined threshold, and issue an output signal when the ripple current and ripple voltage exceed the predetermined threshold.

A health monitoring system for monitoring a condition of a capacitor in a power inverter circuit in accordance with the present disclosure may include a ripple voltage detector connected across the capacitor, a ripple current detector connected in series with the capacitor, and a measuring module connected to the voltage and current detectors operable to produce a signal representative of the ripple voltage and current and send an output to a controller if the signal exceeds a predetermined threshold. The measuring module may includes an analog-to digital-converter connected to a microprocessor which generates the output to the controller. The ripple voltage detector may be a voltage divider module and the ripple current detector may be a rectifier and amplifier module. The outputs of the voltage divider module and rectifier and amplifier module are preferably fed to an analog-to-digital converter, which in turn produces an output fed to the microprocessor.

The disclosure includes methods and apparatuses which perform these methods, including data processing systems which perform these methods, and computer readable media containing instructions which when executed on data processing systems cause the systems to perform these methods. Other features will be apparent from the accompanying drawings and from the detailed description which follows.

BRIEF DESCRIPTION OF THE DRAWINGS

The embodiments are illustrated by way of example and not limitation in the figures of the accompanying drawings in which like references indicate similar elements.

DETAILED DESCRIPTION

The following description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

Figure 1:
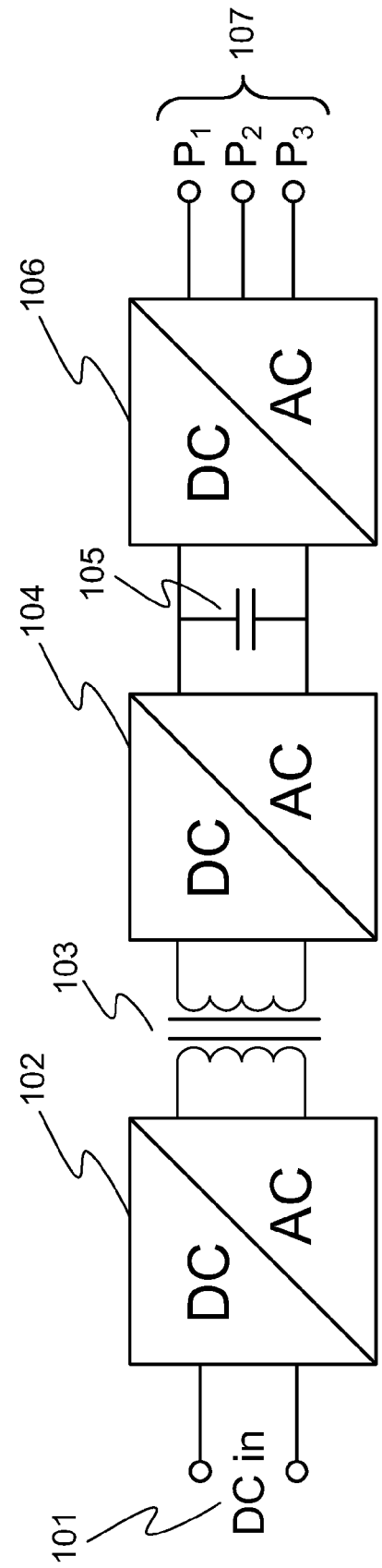
FIG. 1 is a schematic overview of a power inverter system in accordance with the present disclosure.

FIG. 1 shows an overview of a power inverter 100 in accordance with the present disclosure. An initial circuitry 102, typically referred to as a chopper, takes in the DC power from the source 101 and converts the power to radio frequency (RF) power. The size and weight and cost of transformers typically shrinks in accordance with T=1/square of the frequency. Thus, the higher the frequency, the smaller the transformer. However, this is counterbalanced by switching losses, that increase with frequency, and so, for each system there is an optimal point or range of transformer physical configurations in which to operate. The RF power is typically fed, from the chopper circuit 102, to a transformer 103 which is used to increase the voltage (in some applications the transformer may be unnecessary). Then the RF power is then typically fed to a rectifier module 104 that rectifies the high voltage RF to produce high voltage DC. Capacitor 105 supports the high voltage DC bus coming out of the rectifier module 104, typically with a large capacitor or even a bank of capacitors, because, depending on the output frequency of the final inverter stage module 106, the current demand on the bus may exceed the supply fed by module 104.

For purposes of this document, capacitor and capacitor bank shall be used interchangeably. Typically, inverter module 106 takes the high voltage DC and creates a one-, two-, or three-phase supply output 107, indicated as P1, P2, and P3, respectively, to feed the power transmission grid or a local AC supply. Because the grid typically runs at much lower frequency than the RF chopper 102, the capacity of capacitor 105 must be very large, large enough to hold the differences in current flow due to the waveforms and frequencies typically used in an AC grid.

Figure 2:
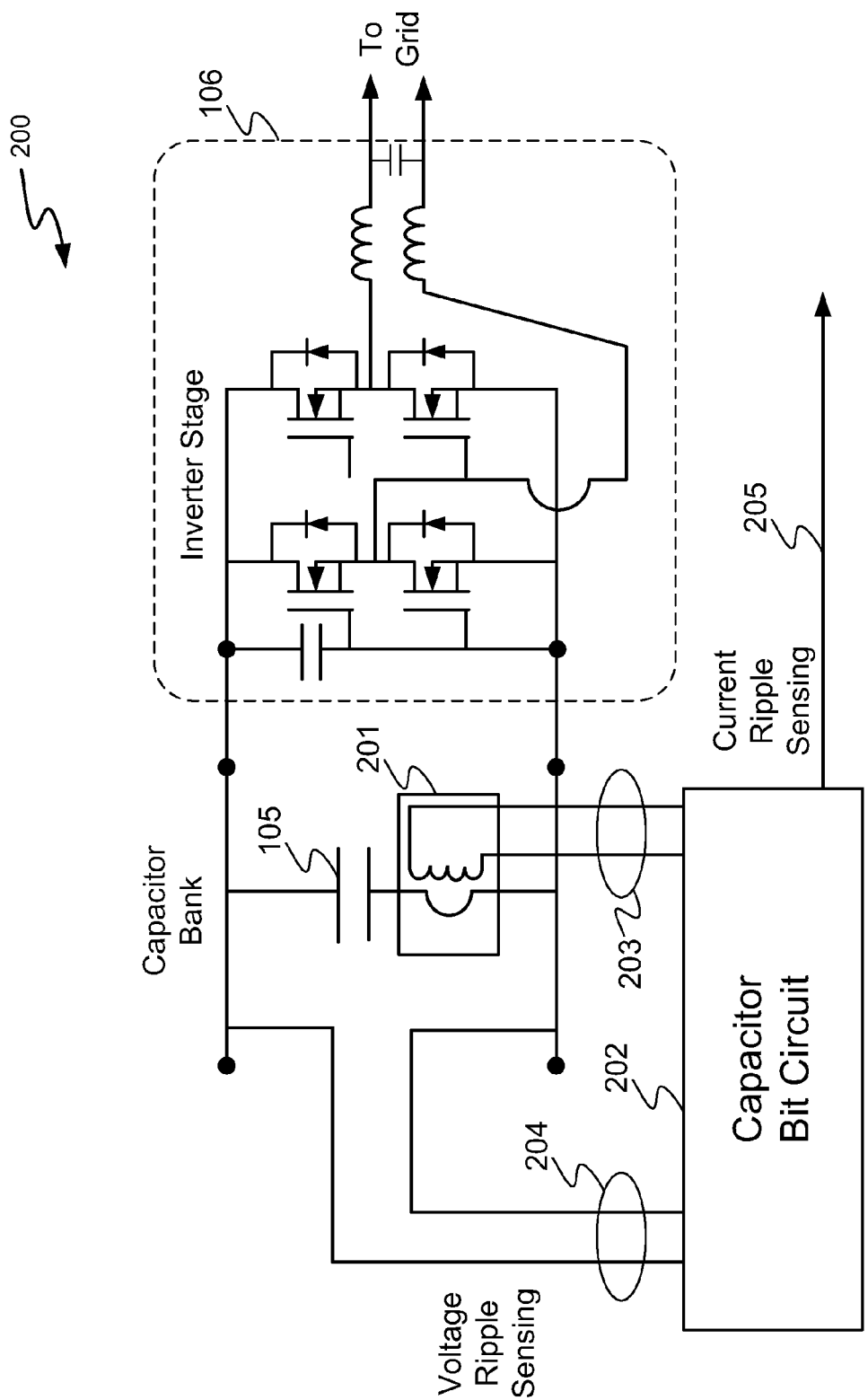
FIG. 2 is a schematic representation of a capacitor module in the system shown in FIG. 1.

FIG. 2 shows a schematic overview of an exemplary capacitor module 200, according to the system and method disclosed herein. The capacitor or capacitor bank 105 is, in this example, connected to a ripple current sensor 201. In some cases sensor 201 is an inductive transformer, although in other cases it could be a Rogowski transformer or coil, which is basically a toroid of wire used to measure an alternating current through a cable encircled by the toroid.

Alternatively a very low-resistance resistor, typically in the low milliohms may be used in series with the capacitor 105, just enough to measure the ripple current. Some specialized low ohm measuring resistors that may be utilized have four leads, to allow a more accurate measurement. The large capacitor 105 is connected to the inverter stage circuit 106.

The inverter circuit 106 is shown in FIG. 2 in greater detail than in FIG. 1. The capacitor controller or supervisory controller circuit 202 is shown by example in more detail in FIG. 4. The controller circuit 202 has a conventional built-in test circuit for the capacitor 105, because, preferably, large capacitors must be tested for every line cycle (in this case, typically twice the line frequency, so, 100, Hz or 120, Hz respectively). Also present are connection 203 to measure the ripple current and connection 204 for measuring the voltage on the dc bus from rectifier module 104 described above, as well as the amplitude and frequency of any ripple voltage on the bus. Connection 205 could be a wireless connection or other network connection to another processor, etc., to send maintenance reports and notifications reflecting the measurements of the ripple current.

Figure 3:
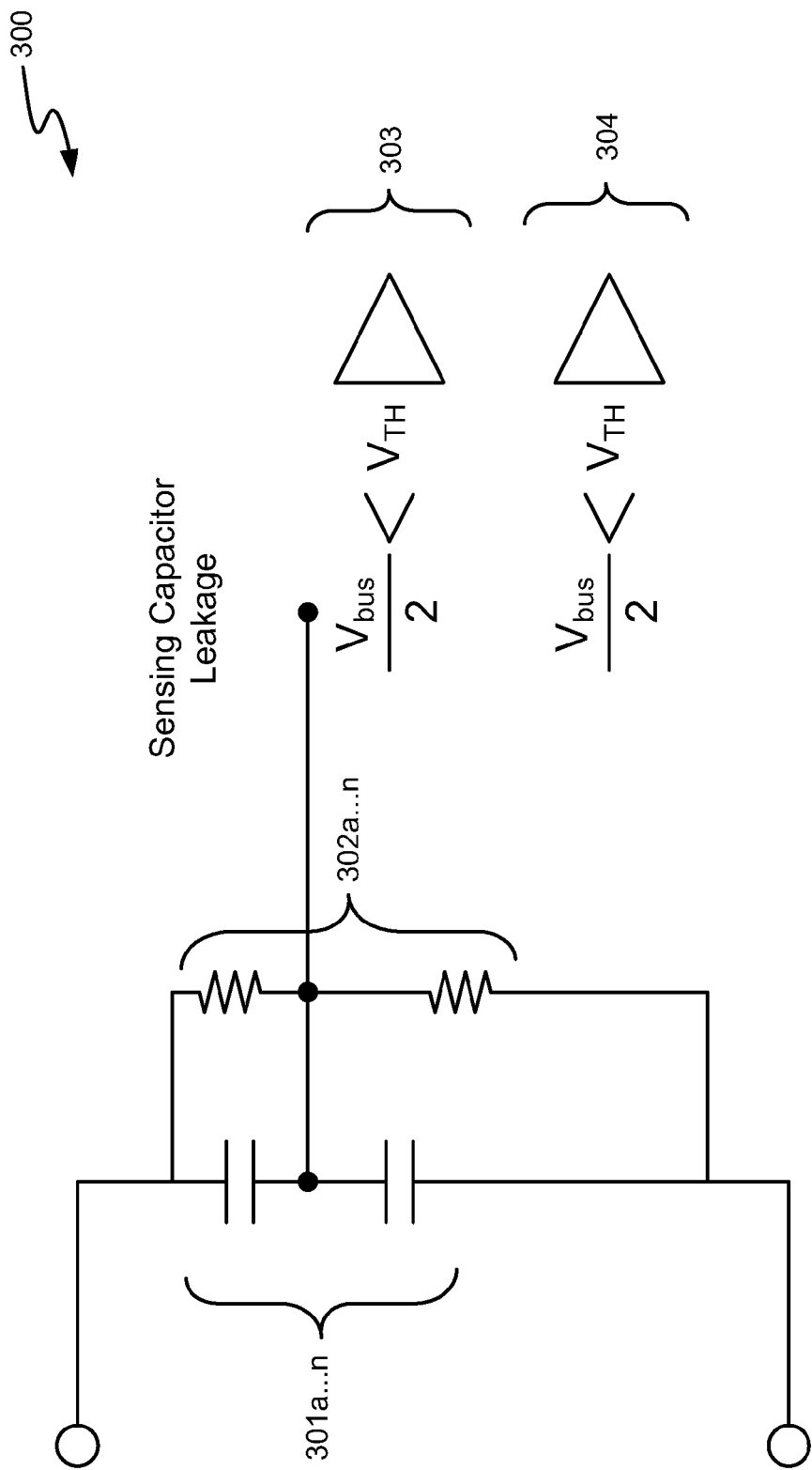
FIG. 3 is a circuit diagram for sensing capacitance leakage in a capacitor module in accordance with the present disclosure.

FIG. 3 shows an exemplary circuit 300 for sensing capacitor leakage, according to the system and method disclosed herein. Capacitors, such as capacitors 301a-n, (of which two are shown, for exemplary purposes), are placed in banks, in series and sometimes in parallel, or both. Often some high-resistance resistors 302a-n, are used across the capacitors 301a-n, to align the voltages. Such resistors are also part of a discharge circuit that is typically required for safety reasons to dissipate the charge on the capacitors 301a-n, when they are electrically removed from service.

As one of the capacitors 301a-n, starts to dry out, its capacity reduces, and accordingly the voltage distribution, as measured by elements 303 and 304, typically voltage dividers, can be used to monitor any such changes and could connect to controller 202 as well. These elements 303 and 304 may be used to measure a drift off the voltage balance, indicating the dry-out of one or more of the capacitors, resulting in reduced performance and eventual failure.

Figure 4:
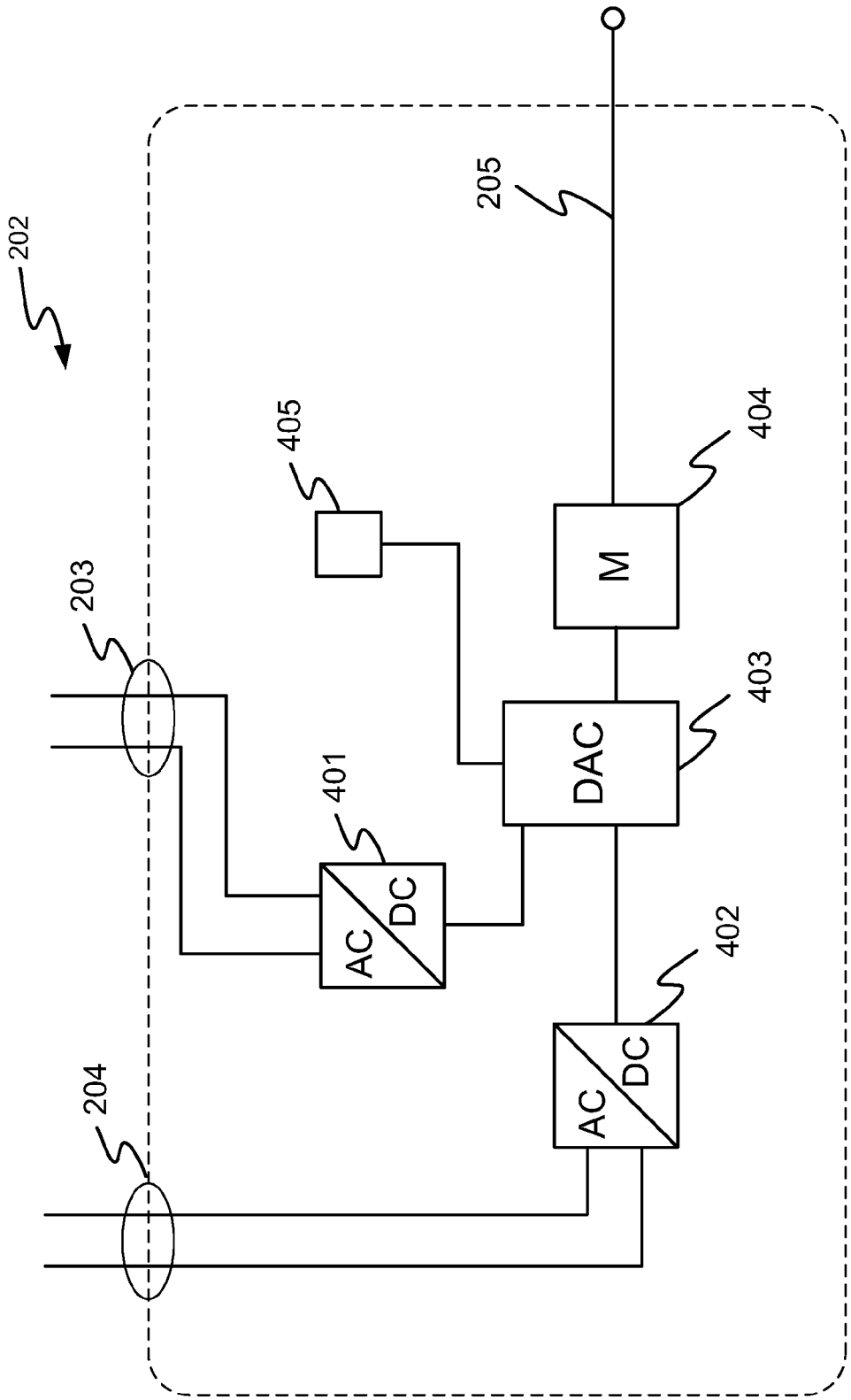
FIG. 4 is a circuit diagram of the internal capacitor module in accordance with the present disclosure.

FIG. 4 shows an exemplary layout of the inside of controller circuit 202 shown in FIG. 2 in more detail, according to the system and method disclosed herein. Input connections 204 (voltage ripple sensing) and 203 (current ripple sensing) are conditioned by reconditioning circuits such as a voltage divider module 402 and rectifier and amplifier module 401 respectively. Their outputs are then fed, as direct current, into an analog-to-digital converter (DAC) 403. The DAC 403 delivers the digitized results into microprocessor 404. Microprocessor 404 is an embedded microprocessor that contains memory, program storage, communications, etc. An output signal line 205 extends from the microprocessor 404 to communicate with the rest of the system 100.

Exemplary circuit 202 also contains a temperature sensor 405 that is also connected to the DAC 403. Some microprocessors made for industrial applications may have some or all the elements described here built in, some may even include the temperature sensor 405 and output to or incorporate a wireless communication network. For the purposes of describing the system and method disclosed herein, all these variations are included.

Figure 5:
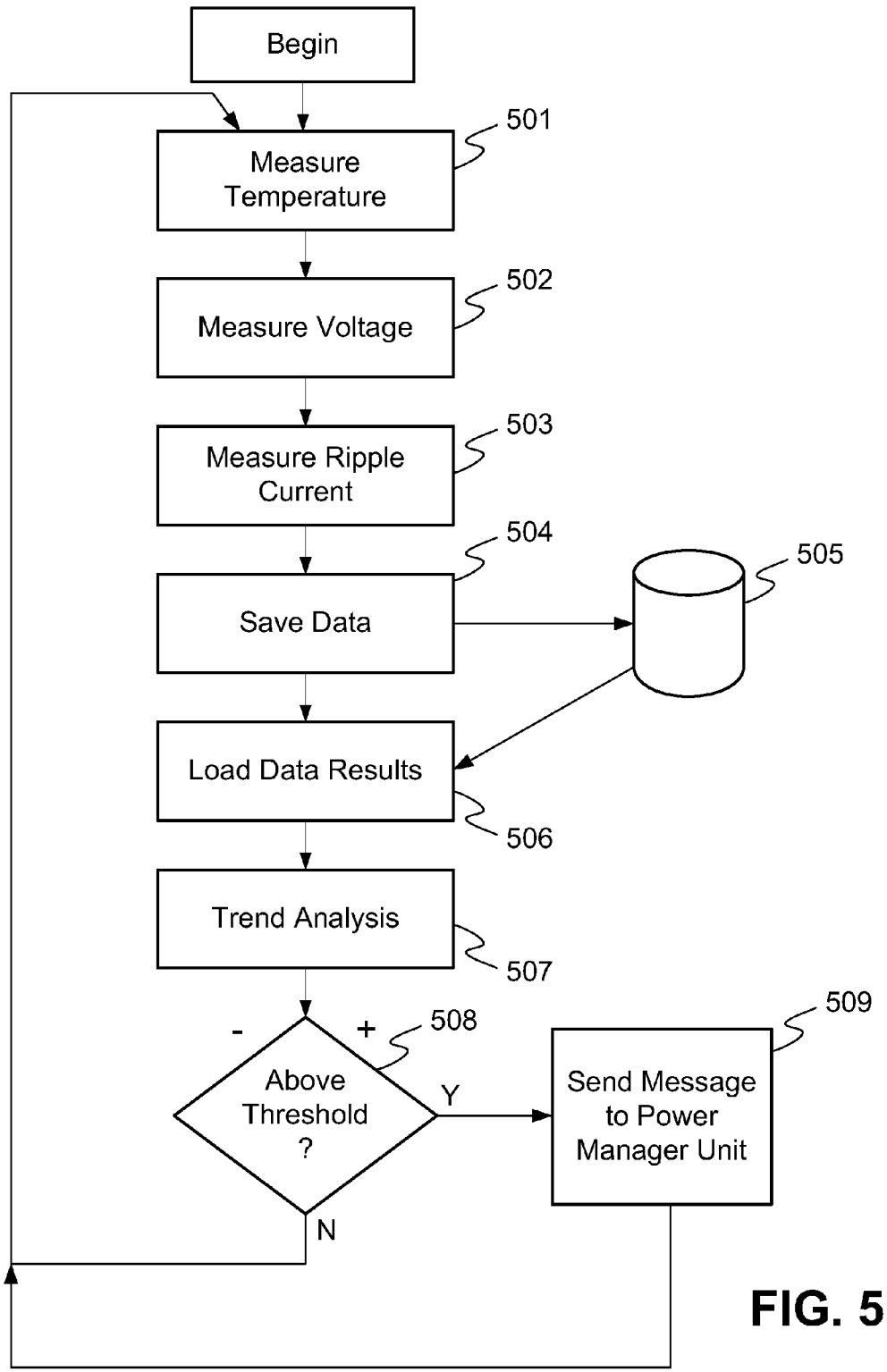
FIG. 5 is a process flow diagram for the system in accordance with the present disclosure.

FIG. 5 shows an exemplary process 500 that may be executed by a programmable computer or by code in the microprocessor 404 for implementation of the system, according to one aspect of the system and method disclosed herein. Control flow begins at operation 501. In operation 501 the system measures the local ambient temperature, typically expected to be about the same as the capacitor temperature. Control then transfers to operation 502.

In operation 502, the bus voltage is measured, as well as the amplitude and frequency of any ripple voltage on the bus at connection point 204. In some cases, more than one voltage may be measured, such as, for example, if there is a series of capacitors, as described above in the discussion of FIG. 3. Control then transfers to operation 503.

In operation 503, the ripple current at point 203 is measured. Control then transfers to operation 504 In operation 504 the ripple voltage and ripple current data is saved into a storage unit 505, which could be, for example, an EPROM, a flash, or other suitable nonvolatile memory, either in or attached to the microprocessor (not shown). Control then transfers to operation 506.

In operation 506 the system loads a data raster with past data and the current measured data, and control transfers to operation 507.

In operation 507 the system executes a trend analysis on the loaded current and past measured data. Control then transfers to query operation 508 where the query is made whether the trend analysis projection is at or above a predetermined threshold or below the predetermined threshold.

If the trend analysis results in projections exceeding certain predetermined threshold values, control transfers to operation 509 where the system sends a message to a power master management unit coupled to it via communication link 205 (not shown). Such a message typically may include a unit ID, a time and date stamp, the type and location of the trouble threshold, and expected time to initial failure. This message preferably will permit maintenance personnel to schedule exchange of the capacitor (bank) in a timely, non-disruptive manner. If, in operation 508, the predetermined values are not exceeded, and are not trending toward exceeding those predetermined values, control returns to operation 501 and the process begins again.

The sending of a message to the power master management unit by the system in accordance with the present disclosure is further discussed in our U.S. Pat. No. 7,602,080,, the disclosure of which is incorporated herein by reference in its entirety.

Figure 6:
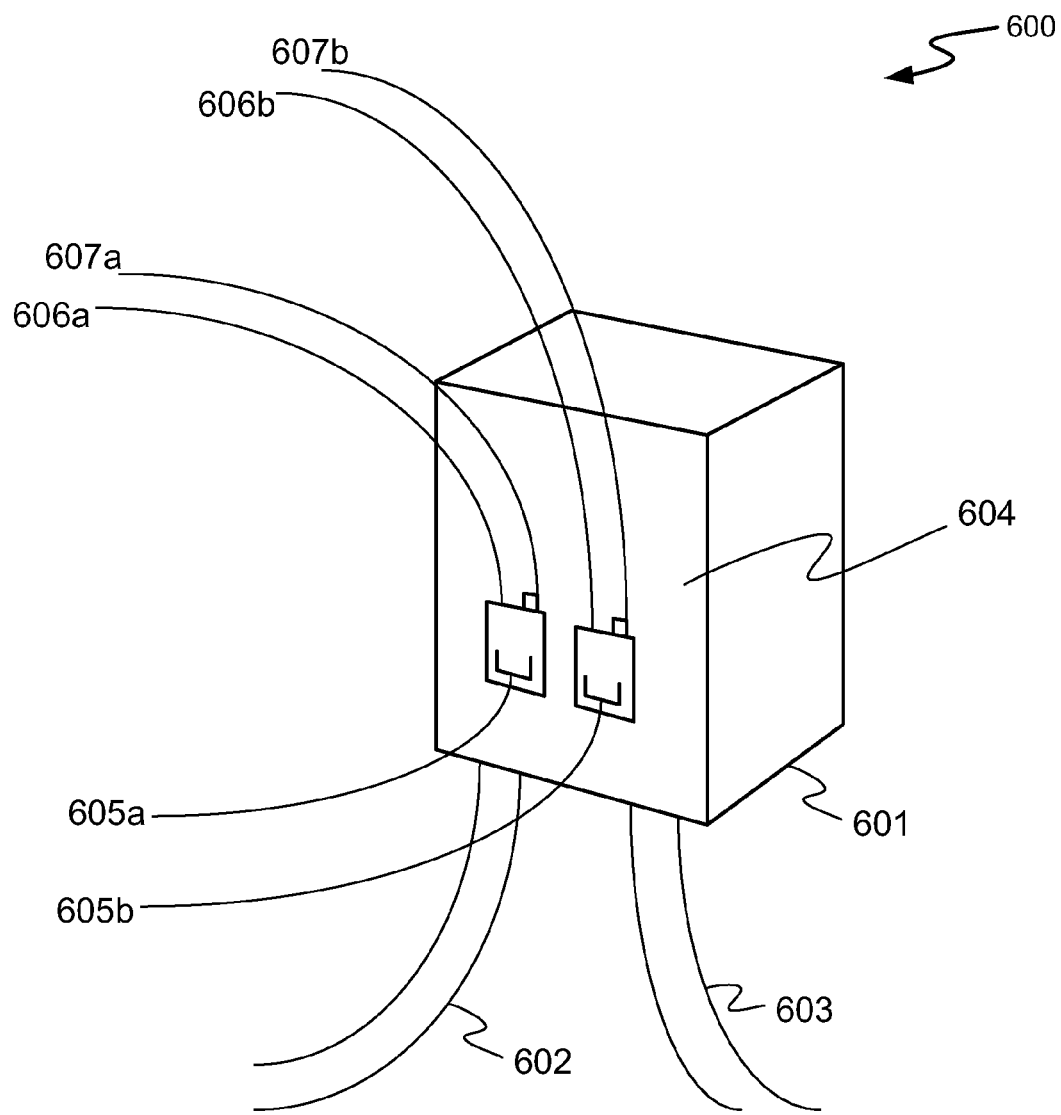
FIG. 6 is a perspective view of an exemplary inverter box in accordance with the present disclosure.

FIG. 6 is a simplified schematic perspective view of an exemplary inverter box 600, according to the system and method disclosed herein. Box 600 typically has a bottom plate 601 where cables, such as the feeding cable 602 enter and grid cable 603, come out. The internal circuitry within the box 600 is described above with reference to FIGS. 1-5. On the front 604 of the box 600 are two capacitor bank units 605a, and 605b, with handles 606a, and 606b, and securing latches 607a, and 607b. This proposed configuration is similar to the configuration used in high-power fuse blocks that support arc-free or arc-secured removal while in operation without requiring the operator to touch any conductors. Such configurations have conductor blades that are broad enough for low-impedance connection to the rest of the circuitry, thus enabling the system to continue operation during the removal and replacement of the capacitor or capacitor bank or block.

With more than one block or capacitor bank units, capacitors can be swapped without having to shut down the transmission system. In cases where only a single block is used, a shut-off button or switch (not shown) may be placed next to the block, so that the operator can switch the block off and then wait for an indicator light (not shown) such as, for example, a green light, to indicate that it is now safe to remove the block without danger of discharge.

This interchangeable capacitor bank approach in accordance with the present disclosure has a huge advantage over the use of a conventional aluminum capacitor bank because of the size and weight burden that aluminum capacitors place on the typically used circuit board inside a converter or inverter, and also because they are vibration-sensitive and need to be ruggedized for applications such as, for example, automotive, airplane, and marine uses, etc.

Figure 7:
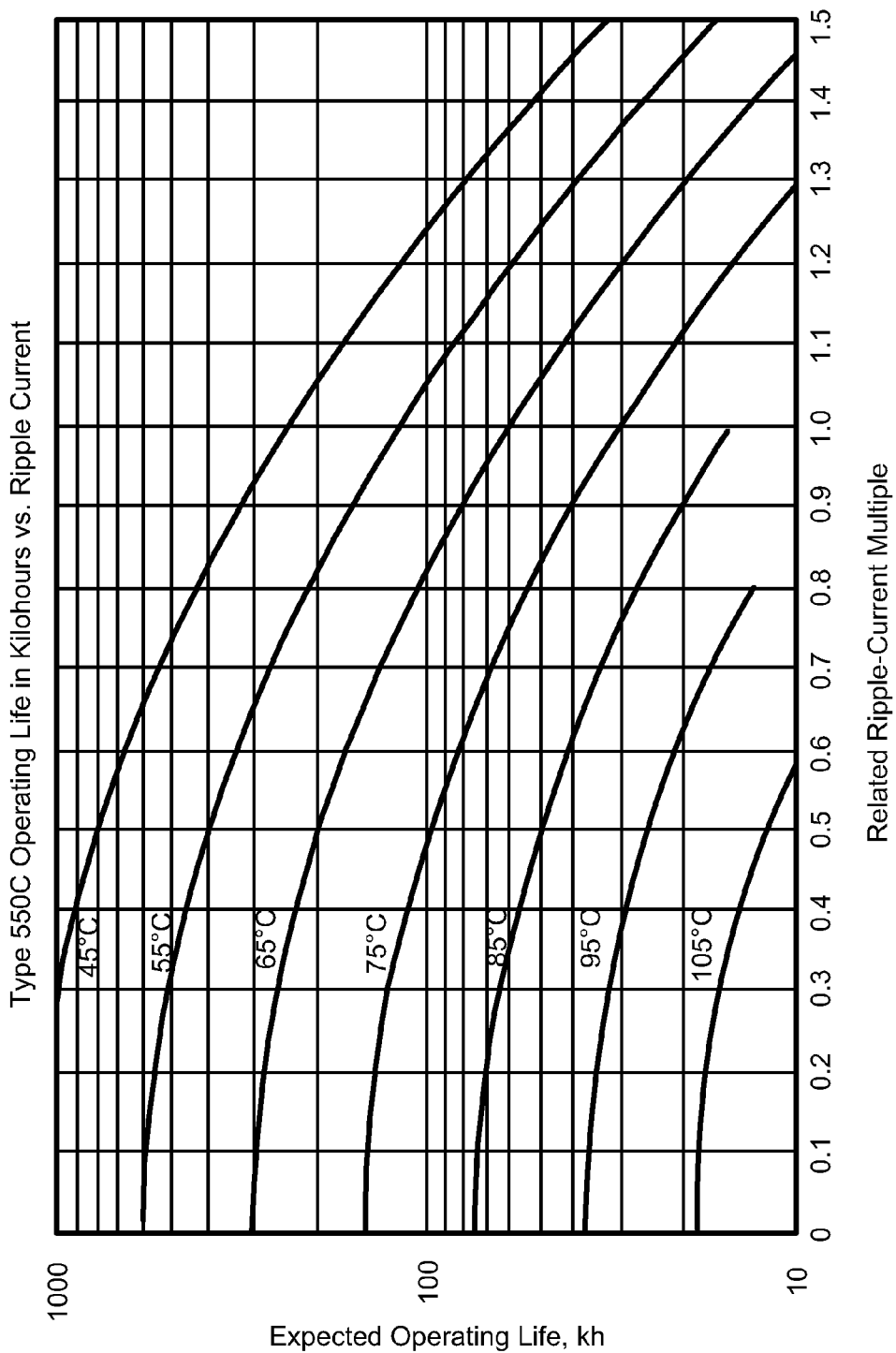
FIG. 7 is a graph of capacitor life expectancies for a long life aluminum capacitor.
Figure 8:
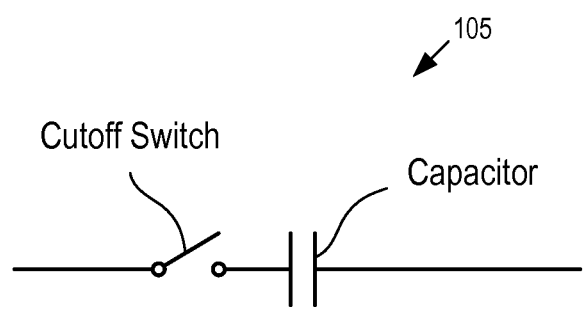
FIG. 8 illustrates a capacitor having a cutout switch for selectively removing the capacitor for electrical connection according to one embodiment.

FIG. 7 is a graph that shows a diagram of the life expectancy of a long-life aluminum capacitor in a high ripple current use application, such as in inverters and converters utilized in high power transmission applications. For most applications, the operating temperature of inverters is such that capacitors run between 55° C. and 65° C. Therefore, having more than one capacitor or capacitor bank available, and monitored, at all times achieves an overall lower actual time to failure, and increases the chance of the system operators being notified before a catastrophic system failure occurs.

In the foregoing specification, the disclosure has been described with reference to specific exemplary embodiments thereof. It is clear that many modifications and variations of the system and method disclosed herein may be made by one skilled in the art without departing from the spirit of the novel art of this disclosure. These modifications and variations do not depart from its broader spirit and scope as set forth in the following claims.

What is claimed is:

1. A method comprising:
providing a capacitor having a cutout switch to selectively remove the capacitor from electrical connection to a circuitry of a power inverter;
measuring a ripple voltage on the capacitor;
measuring a ripple current through the capacitor;
determining a representative signal from the ripple voltage and current measurements;
determining whether the signal exceeds a predetermined threshold; and
sending an output to a controller if the signal exceeds the predetermined threshold.

2. The method according to claim 1 wherein the ripple current and ripple voltage measurements are provided as inputs to a digital to analog converter and wherein the converter produces and sends the representative signal to a microprocessor to generate the output to the controller.

3. The method according to claim 1 wherein the measuring of ripple current is performed by a rectifier and amplifier module to produce a direct current representative signal.

4. The method according to claim 1 wherein the measuring of ripple voltage is performed by a voltage divider module.

5. The method according to claim 2 further comprising sensing a temperature of the capacitor and sending a temperature signal to the digital to analog converter.

6. The method according to claim 2 further comprising recommending to a master module replacing the capacitor when the controller receives an output from the microprocessor.

7. A power inverter comprising:
a box housing an electrical circuit therein including a dc to ac converter;
at least one electrolytic capacitor mounted to an exterior of the box, the capacitor being connected with the electrical circuit within the box, the capacitor including a cutout switch for selectively removing the capacitor from electrical connection to the circuitry within the box; and
a capacitor health monitoring circuit operably connected to the capacitor to measure a ripple voltage on the capacitor, and
measure a ripple current through the capacitor.

8. The inverter according to claim 7 wherein the monitoring circuit includes a microprocessor programmed to perform operations of:
determining a representative signal from the ripple voltage and current measurements;
determining whether the signal exceeds a predetermined threshold; and
sending an output to a controller if the signal exceeds the predetermined threshold.

9. The inverter according to claim 7 wherein the ripple current and ripple voltage are analyzed in a microprocessor programmed to compare a signal representative of the ripple current and ripple voltage to a predetermined threshold.

10. The inverter according to claim 9 wherein the monitoring circuit issues an output signal when the ripple current and ripple voltage exceed the predetermined threshold.

11. The inverter according to claim 7 wherein the health monitoring circuit has a current sensor in series with the capacitor.

12. The inverter according to claim 7 wherein the health monitoring circuit is connected in parallel with the capacitor.

13. The inverter according to claim 7 wherein the health monitoring circuit includes a temperature sensor operable to sense ambient temperature around the capacitor.

14. A health monitoring system, the system comprising:
a capacitor having a cutout switch to selectively remove the capacitor from electrical connection to a circuitry of a power inverter;
a ripple voltage detector connected across the capacitor;
a ripple current detector connected in series with the capacitor;
a measuring module connected to the voltage and current detectors operable to produce a signal representative of the ripple voltage and current and send an output to a controller if the signal exceeds a predetermined threshold.

15. The system according to claim 14 wherein the measuring module includes an analog-to-digital converter connected to a microprocessor which generates the output to the controller.

16. The system according to claim 14 wherein the ripple voltage detector is a voltage divider module.

17. The system according to claim 16 wherein the ripple current detector is a rectifier and amplifier module.

18. The system according to claim 17 wherein outputs of the voltage divider module and rectifier and amplifier module are fed to an analog-to-digital converter.

* * * * *